United States Patent [19]

Murayama et al.

[11] Patent Number: 5,013,416
[45] Date of Patent: May 7, 1991

[54] PROCESS FOR MANUFACTURING TRANSPARENT, CONDUCTIVE FILM

[75] Inventors: Yoichi Murayama, 304, Domusu Mejiro 17-44, Shimoochiai 3-chome, Shinsuku-ku, Tokyo, 161; Tetsuya Nomachi, Kyoto, both of Japan

[73] Assignees: Tobi Col, Ltd., Osaka; Yoichi Murayama, Tokyo, both of Japan

[21] Appl. No.: 585,263

[22] Filed: Sep. 19, 1990

Related U.S. Application Data

[63] Continuation of Ser. No. 124,208, filed as PCT JP87/00152 on Mar. 11, 1987, published as WO87/05742 on Sep. 24, 1987, abandoned.

[30] Foreign Application Priority Data

Mar. 12, 1986 [JP] Japan .................... 61-54162

[51] Int. Cl.$^5$ .................... C23C 14/08; C23C 14/32
[52] U.S. Cl. .................... 204/192.1; 204/192.14; 204/192.29; 204/298.05; 427/40
[58] Field of Search .................... 204/192.14, 192.29, 204/192.31, 298.05; 427/40

[56] References Cited

FOREIGN PATENT DOCUMENTS

| | | | |
|---|---|---|---|
| 62-222518 | 9/1987 | Japan | 204/192.29 |
| 63-0475 | 1/1988 | Japan | 204/298 PI |
| 1-313810 | 12/1989 | Japan | 204/192.31 |

*Primary Examiner*—Aaron Weisstuch
*Attorney, Agent, or Firm*—Wenderoth, Lind & Ponack

[57] ABSTRACT

A conductive thin film is deposited on the surface of plastic film moving at high velocity by ion-plating using a pressure-gradient discharge. The moving velocity of the substrate film is as high as 8 to 30m/min. A conductive, thin film composed of indium oxide, tin oxide, TTD and similar substances is deposited on the plastic film, at a pressure of $1 \times 10^{-5}$ to $1 \times 10^{-1}$ Torr and a discharge voltage of 50 to 100 V.

2 Claims, 3 Drawing Sheets

PROCESS FOR MANUFACTURING TRANSPARENT, CONDUCTIVE FILM

This application is a continuation of now abandoned application Ser. No. 07/124,208 filed as PCT JP87/00152 on Mar. 11, 1987, published as WO87/05742 on Sep. 24, 1987.

BACKGROUND OF THE INVENTION

A. Field of the Invention

This invention relates to a process for manufacturing a transparent, conductive film. In more detail, the invention relates to a process for manufacturing a high-quality transparent, conductive film at high speed using the ion-plating method

B. Description of the Prior Art

Conductive film consisting of plastic, etc. is used in various fields such as for antistatic materials, electromagnetic wave shields, touch panels and display units. A process for manufacturing a conductive film by depositing a thin film of a conductive material such as a metal and metal oxide on the surface of a film made from plastics, as well as a process for providing an organic polymer itself with conductivity are generally well-known.

The process of providing an organic polymer film with conductivity is, however, now in the fundamentally investigative stage. There are many unsolved problems remaining in the process of depositing a thin film of a conductive material, though commercialization is expected.

Methods have been proposed for depositing thin films such that the thin film is deposited on the surface of plastic film moving from a delivery roll to a wind-up roll by methods such as metalizing, sputtering and hollow cathode ion-plating. These methods, however, have serious problems such as poor productivity due to the low depositing reactivity of the thin films, the inevitable adhesion of dirt to the manufacturing equipment including the cathode, low thermal stability and unavoidable heat build-up in the plastic substrate. Therefore, thin conductive films with good conductivity, high adhesiveness to the substrate, good durability and uniform quality have not been effectively manufactured.

Meanwhile, an ion-plating method using a pressure-gradient discharge plasma gun has also been proposed (see the Japanese publication entitled *Vacuum*, Vol. 27, No. 2, Pg. 64, 1984). According to this method, a pressure-gradient discharge is conducted such that an intermediate electrode is located between the anode and cathode, while maintaining pressures at the anode and cathode regions at approximately 1 Torr and $10^{-3}$ Torr, respectively.

Such ion-plating method is used for dry-coating on the surface of the material to be treated so that the plasma flow is emitted horizontally from the plasma source and turned perpendicularly right above the source material crucible, which is placed facing upward so that the plasma converges to ionize the raw material for the thin film.

The method has many advantages such as non-adhesion of the dirt on the plasma gun, a high reaction rate, uniformity, and high adhesion of the thin film to the substrate.

Ion-plating by gradient discharge has never been adequately investigated in terms of applied technology and in respect to the development of a practical apparatus. Especially, the application of ion-plating to the manufacture of transparent conductive film at high speed, and the selection of the operational conditions and process, as well as the dry-coating of moving articles of a film material have not yet been developed.

Such a film having high transparency, (which high transparency is indispensible for practical use as a functional film), has not yet been manufactured.

This invention aims to provide an effective process free from those problems involved in manufacturing a high-quality, transparent, conductive film. In more detail, the invention provides a process for manufacturing a transparent, conductive film at high speed according to the ion-plating method and winding the film on a wind-up roll.

DETAILED DESCRIPTION OF THE INVENTION

This invention entails a process for manufacturing a transparent, conductive film by a high-speed ion-plating method using a pressure-gradient discharge and deposition of a thin film of conductive material such as indium oxide, tin oxide, ITO, etc. on the surface of a film moving at high velocity from the delivery roll to the wind-up roll.

The pressure-gradient discharge is made such that an intermediate electrode is located between the anode and the cathode and wherein the pressure at the anode and cathode regions is maintained at approximately 1 Torr and $10^{-3}$ Torr, respectively. Use of this discharging method for ion-plating has already been proposed in *Vacuum*, Vol. 27, No. 2, pg. 64, 1984, described above.

As mentioned above, the ion-plating method is used for dry-coating on the surface of material to be treated so that plasma flow is emitted horizontally from the plasma source and turned perpendicularly right above the source material crucible, which is placed facing upward so that the plasma converges to ionize the raw material for the thin film.

This method has many advantages such as non-adhesion of dirt on the plasma gun, a high reaction rate, uniformity, and high adhesion of the thin film.

Ion-plating by pressure-gradient discharge has never been adequately investigated in terms of applied technology and in the development of practical equipment. Especially, the application of ion-plating to manufacturing a transparent, conductive film at high speed and the selection of operational conditions and process, as well as the dry-coating of moving articles of film material, have not yet been developed. This invention has realized the above-mentioned items for the first time.

Figure 1:
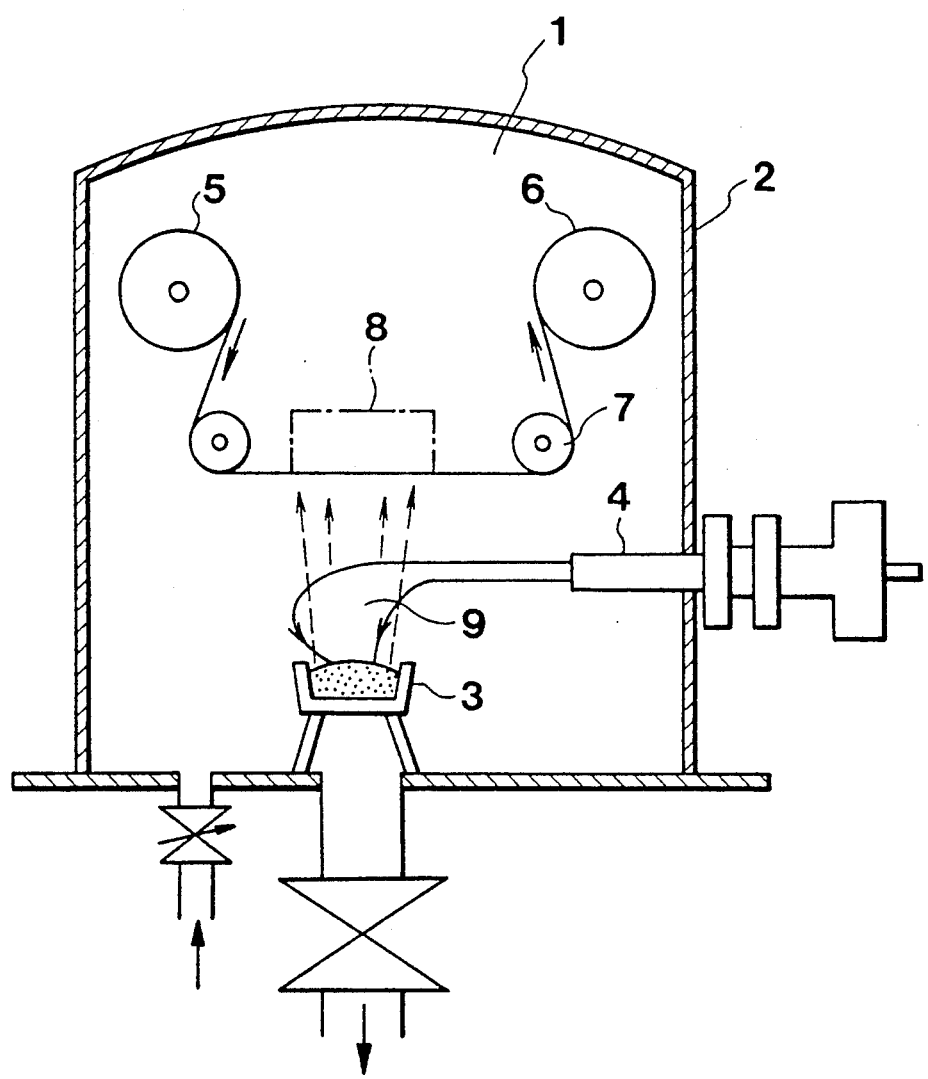
FIG. 1 shows an example of the equipment for manufacturing a transparent, conductive film according to this invention.

This invention is illustrated in more detail with reference to the attached figure, FIG. 1, as follows:

(1) is a vacuum chamber which is formed by bell-jar (2). The vacuum chamber is evacuated by a vacuum pump. The bell-jar (2) has an inlet for the reaction gas and a vacuum port. The crucible (3) for the raw material for the transparent, conductive thin film, pressure-gradient plasma gun (4), film delivery roll (5), and the wind-up roll (6) of transparent, conductive film are mounted in the bell-jar (2). If necessary, guide-rolls (7) and cooling device (8) may be installed.

Although the cross-section of a box-type bell-jar is shown in FIG. 1, the shape and construction are not necessarily limited to this type.

Figure 2:
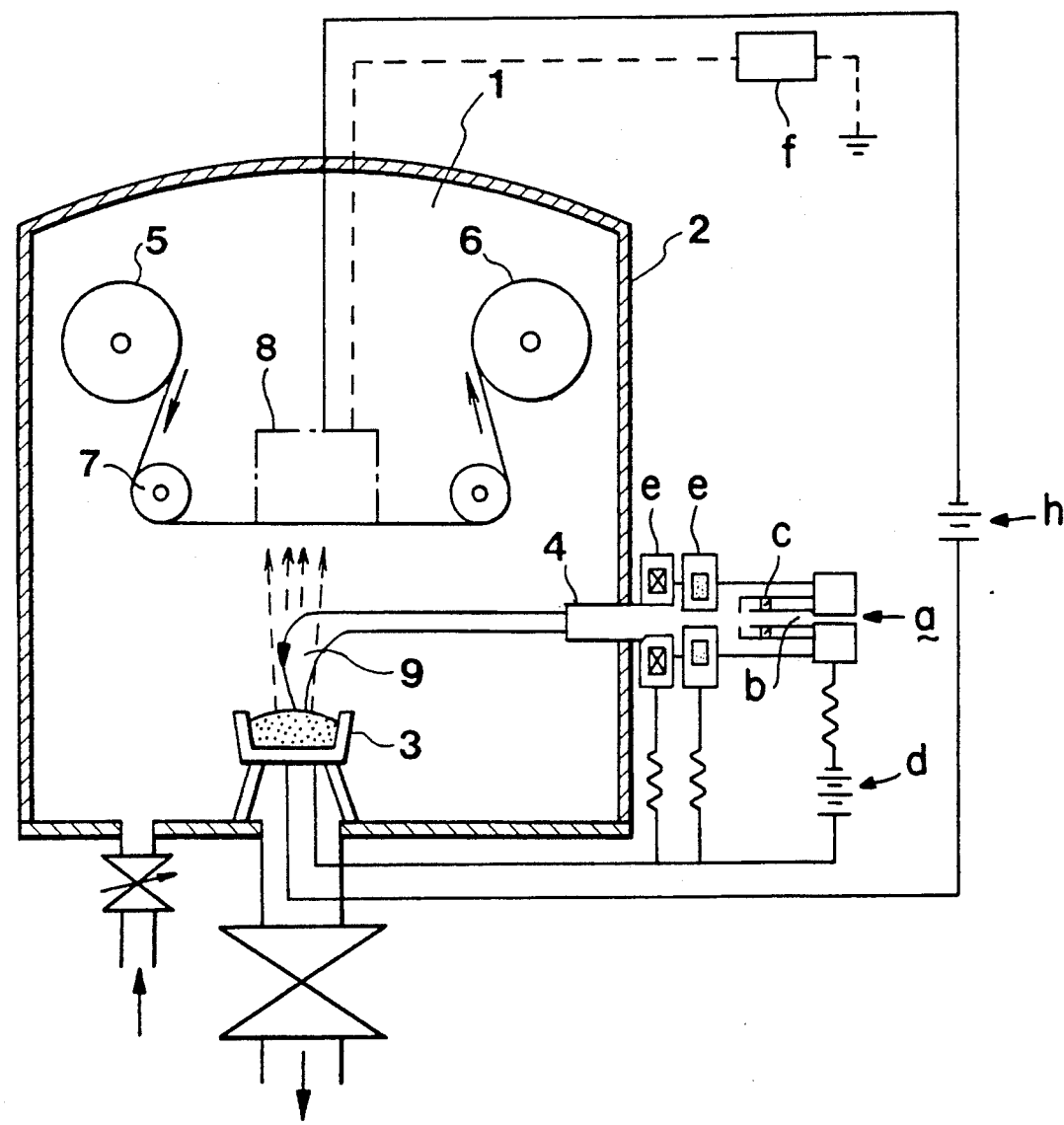
FIGS. 2 and 3 illustrate variations of ion plating procedures using the pressure-gradient discharge plasma gun according to the present invention.
Figure 3:
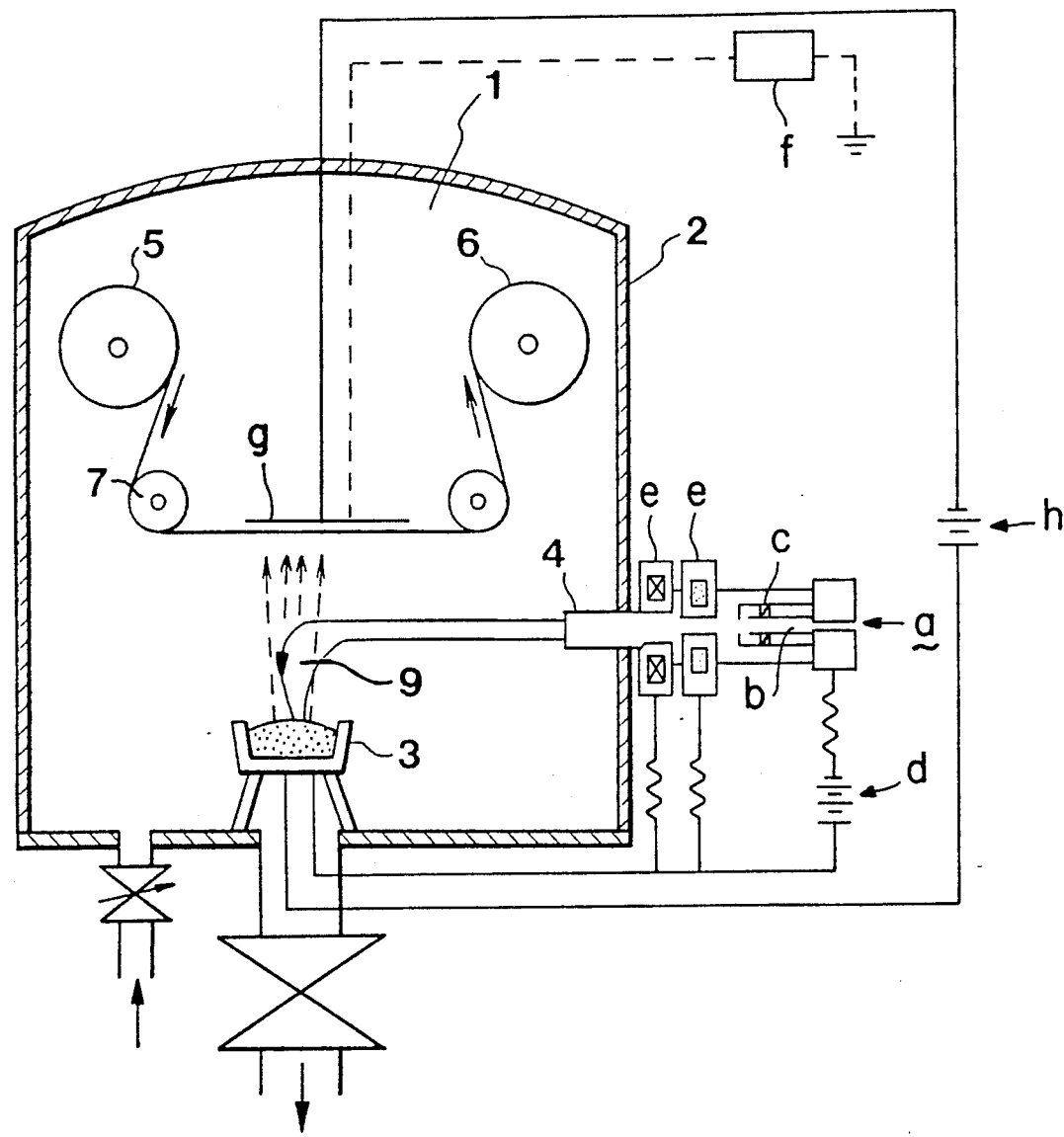

As shown in FIGS. 2 and 3, plasma gun (4) is incorporated with an electrode (c) having an inlet (b) for introducing inert gas, reacting gas, etc. (a) in the central part of the gun. By applying voltage from a discharge power supply (d) to this electrode (c) as a cathode and crucible (3) as an anode, the inert gas, reacting gas, etc. (a) introduced through plasma gun (4) are excited to generate a plasma. In this case, a pressure gradient is formed by maintaining the cathode electrode (c) region of plasma gun (4) at about 1 Torr and the crucible (3) region as an anode at about $1 \times 10^{-3}$ Torr. As a result, a plasma beam (9) is formed from plasma gun (4) to crucible (3), which makes it possible to emit a plasma beam (9) to the evaporating source filled in crucible (3). In such a pressure-gradient plasma gun (4), generally, intermediate electrodes (e) for controlling the plasma beam behavior are installed close to the cathode electrode (c).

A water-cooling or air-cooling device is installed to cool the driving gear of the rolls. A heating device such as an electric resistance heater, electron-beam heater, high-frequency heater etc. can be used as the evaporating heat source, taking the nature of the evaporated material and productivity into consideration.

The bell-jar may be furnished with a gate on the side wall to freely permit installation and removal of the rolls, crucible, etc.

The method of applying a negative voltage to the film will be explained as follows:

As shown in FIG. 3, for example, an electrode (g) coming into contact with the opposite side surface to the thin film formation surface of the film moving over crucible (3) is installed and a bias voltage is applied through the electrode (g) by an electric power supply (f) connected to the electrode (g). furthermore, it is possible to apply a negative voltage to a moving film by connecting the electrode (g) electrode to crucible (3) through an electric power supply (h). Moreover, it is possible to directly apply a bias voltage to cooling means (8) by connecting it to an electric power supply, the same as the above-mentioned electric power supply (f) or (h), if the cooling means (8) is used, as shown in FIG. 2. Further, any suitable method is selected.

Naturally, the method based on the invention is not limited to the equipment mentioned above.

For instance, the rolls need not necessarily be installed inside the bell-jar. A film moving mechanism may be installed in pretreatment sections such as a plasma bombarding treatment station or a post-treatment station adjoining the thin film depositing station by passing the film through a slit formed on the side wall of the bell-jar. A radio frequency exciting plasma device can be also installed in the space above the crucible.

The process conditions for manufacturing transparent, conductive film using high-speed film ion-plating equipment shown in FIG. 1 will now be described:

Any heat-resistant film made from polyester such as a polyethylene terephthalate (PET), a polysulfone, a polyimide etc. can be used for the process of this invention by advancing the film at a high velocity as fast as 8 to 30 m/min. The thickness of the substrate can be chosen in a wide range from 5 to 250 μm, depending on the uses of the transparent, conductive film. It is preferable that the width of film be approximately 1.5 m or less.

Conductive oxides such as indium oxide, tin oxide, ITO, etc. and other suitable substances can be used as the raw material for the transparent, conductive thin film.

The reaction pressure is most preferably in the range of from 7 to $9 \times 10^{-4}$ Torr within the larger range of from $1 \times 10^{-5}$ to $10^{-1}$ Torr. Oxygen is introduced in the bell-jar to a partial pressure of $5 \times 10^{-4}$ to $7 \times 10^{-4}$ Torr to produce the thin oxide film. The temperature is 105° C. or less and the discharge voltage is 50 to 100 V. The current is varied according to the amount of evaporated material.

According to this invention, it is now possible to manufacture a highly conductive film with excellent transparency and extremely reduced light transmission at a substrate velocity as high as 8 to 30 m/min., a result which is not possible with conventional technologies.

This invention will now be further illustrated by an example.

EXAMPLE

Transparent, conductive film was manufactured using PET film 250 mm wide. ITO containing 5% of $SnO_2$ was used as the evaporated material. The distance between the crucible containing this raw material and the film was 40 cm. No cooling device was used.

The moving or winding velocity was set at 18 m/min.

The reaction was operated under the following conditions:

| Experiment (1) | Discharge | 250 A/70 V |
| --- | --- | --- |
| | Pressure of argon | $7.5 \times 10^{-4}$ Torr |
| | Pressure of oxygen | $9 \times 10^{-4}$ Torr |
| Experiment (2) | Discharge | 240 A/65 V |
| | Pressure of argon | $8.5 \times 10^{-4}$ Torr |
| | Pressure of oxygen | $1.0 \times 10^{-3}$ Torr |

In Experiment (1), a thin, transparent film with a thickness of 1300 Å and 83% parallel light transmission of 550 nm (87% in the PET blank test) was obtained. The resistance of the film was 140 to 146Ω/□.

Also, in Experiment (2), film with a similar light transmission was obtained. The resistance of the film was 180 to 210Ω/□.

According to the present invention, it is now possible to realize the manufacture of a high-quality, transparent, conductive film at high velocity. The transparent, conductive film is suitable as an antistatic material and as a material for electronic and electric apparatuses such as electromagnetic wave shields, touch panels and indication elements.

What is claimed is:

1. A process for manufacturing a transparent, conductive film which comprises:
   (a) moving a polymer film substrate at high velocity, and
   (b) depositing a transparent conductive thin film on the surface of the polymer film by ion-plating using a pressure-gradient discharge.

2. The process as in claim 1, wherein the polymer film is moved at a velocity of from 8 to 30 m/min.

* * * * *